United States Patent [19]
Akcasu

[11] Patent Number: 5,055,417
[45] Date of Patent: Oct. 8, 1991

[54] PROCESS FOR FABRICATING SELF-ALIGNED HIGH PERFORMANCE LATERAL ACTION SILICON-CONTROLLED RECTIFIER AND STATIC RANDOM ACCESS MEMORY CELLS

[75] Inventor: Osman E. Akcasu, Chippewa Falls, Wis.

[73] Assignee: National Semiconductor Corporation, Santa Clara, Calif.

[21] Appl. No.: 287,577

[22] Filed: Dec. 15, 1988

Related U.S. Application Data

[63] Continuation of Ser. No. 61,754, Jun. 11, 1987, abandoned.

[51] Int. Cl.$^5$ .......................................... H01L 21/266
[52] U.S. Cl. ............................................ 437/6; 437/32
[58] Field of Search ................ 437/6, 26, 28, 31, 32; 357/36, 38, 39

[56] References Cited

U.S. PATENT DOCUMENTS

| | | | |
|---|---|---|---|
| 4,170,501 | 10/1979 | Khajezadeh | 357/48 |
| 4,326,135 | 4/1982 | Jarrett et al. | 357/92 |
| 4,357,622 | 11/1982 | Magdo et al. | 357/44 |
| 4,404,737 | 9/1983 | Kanzaki et al. | 357/59 |
| 4,525,922 | 7/1985 | Kiriseko | 437/31 X |
| 4,577,397 | 3/1986 | Komatsu et al. | 437/31 |
| 4,586,073 | 4/1986 | Hartman et al. | 357/45 |
| 4,646,117 | 2/1987 | Temple | 357/23.4 |
| 4,648,909 | 3/1987 | Krishna et al. | 437/31 |
| 4,656,495 | 4/1987 | Birrittella | 357/34 |
| 4,914,496 | 4/1990 | Nakagawa et al. | 357/38 |

FOREIGN PATENT DOCUMENTS 2358748 2/1978 France.
55-132862 9/1980 Japan.

OTHER PUBLICATIONS

Bartholomew, R. F. et al., "High Performance NPN with Low Resistance Base Contact Self-Aligned to the Emitter," *IBM Technical Disclosure Bulletin* (1978) 21(4): 1554–1557.

Primary Examiner—Olik Chaudhuri
Assistant Examiner—Ourmazd S. Ojan
Attorney, Agent, or Firm—Townsend and Townsend

[57] ABSTRACT

A process is described for fabricating a self-aligned lateral silicon-controlled rectifier circuit which includes the steps of forming an insulating layer 18 on a semiconductor substrate which includes an upper N-type region 12, 15 and a lower P-type region 10, and then forming an impurity mask 21 on the insulating layer 18. Portions of the insulating layer 18 adjacent the impurity mask 21 are then removed, and P conductivity type impurity 33 is introduced into the substrate 15 except where it is protected by the impurity mask 21. Finally, N-type impurity is introduced, also adjacent the impurity mask 21. When the structure is annealed, the impurity is diffused partially beneath the impurity mask to create a lateral SCR structure having a narrow PNP base width.

17 Claims, 3 Drawing Sheets

5,055,417

PROCESS FOR FABRICATING SELF-ALIGNED HIGH PERFORMANCE LATERAL ACTION SILICON-CONTROLLED RECTIFIER AND STATIC RANDOM ACCESS MEMORY CELLS

This is a continuation of application Ser. No. 07/061,754, filed June 11, 1987, now abandoned.

BACKGROUND OF THE INVENTION

1. Field of the Invention

This invention relates to integrated circuits, and in particular to a method of fabricating a compact, high performance silicon-controlled rectifier structure.

2. Description of the Prior Art

A silicon-controlled rectifier ("SCR") is also known as a reverse-blocking triode thyristor. SCRs or thyristors are triggered into conduction in only one direction, from anode to cathode, by a pulse of control current. Once activated, the SCR continues to conduct current whether or not the pulse remains present. Like transistors, SCRs have two terminals for working current and one terminal for control current. Unlike transistors, however, SCRs do not require any further control current once they are turned on. When off, the SCR normally blocks current attempting to pass either way between the anode and cathode of the device. As a result of their unique functionality, SCRs are widely applied in programmable read-only memories (PROMs) to blow fuses, as well as in motor control systems, solid state automobile ignition systems and elsewhere.

A lateral silicon-controlled rectifier structure implemented in integrated circuit form can be viewed as a PNPN structure in which a lateral NPN transistor is merged with a lateral PNP transistor. That is, the PNP base also serves as the NPN collector and the NPN base also serves as the PNP collector. Because of the need to form buried contacts to some of the regions, and because of the use of a P conductivity type wafer and N conductivity type epitaxial layer, the lateral SCR structure will include parasitic vertical transistors. For example, the N-type emitter of the lateral NPN transistor will also function vertically, using those portions of the P-type base beneath the emitter and an underlying N-type buried layer to form a parasitic NPN device. Similarly, a parasitic PNP device also will be formed.

In conventional non-self-aligned SCR structures, the lateral NPN base width of the device will be on the order of 2 to 3 microns. This wide lateral base and associated high Gummel number make the gain of the lateral NPN device very low. Accordingly, it contributes little to active SCR operation, in contrast with the vertical NPN device. Furthermore, the lateral NPN device will not contribute significantly to carrying current in the transport because of the substantial amount of stored charge in and underlying the lateral NPN base region. To turn the SCR on, that stored charge must be supplied or removed. Because device switching speed is proportional to the stored charge difference between the on and off states, the resulting devices operate undesirably slowly.

SUMMARY OF THE INVENTION

I have developed a silicon-controlled rectifier structure, and process for manufacturing it, which substantially reduces the width of the base region of the lateral NPN device. The process of my invention provides a structure which reduces the volume of the region of stored charge beneath the lateral NPN base by a factor of about ten in comparison with prior art structures. This makes the lateral NPN base width and the Gummel number on the same order of magnitude as the associated vertical NPN device. Thus, the gain and reverse saturation current density of both devices is approximately the same, thereby introducing the lateral NPN device into active device operation, which reduces the stored charge still further for the same operating current conditions. In addition, the fabrication process of my invention substantially increases packing density, reduces base-collector capacitance, and reduces parasitic resistance.

In a preferred embodiment, my method of fabricating a self-aligned lateral silicon-controlled rectifier includes the steps of forming an insulating layer on a semiconductor substrate, which substrate includes an upper N conductivity type region and a lower P conductivity type region; forming an impurity mask on the insulating layer over a first region of the substrate; removing at least part of the insulating layer from a second region of the substrate adjacent the first region; introducing P conductivity type impurity into the substrate except where protected by the impurity mask, thereby forming a base region of the vertical NPN device and an injector region of the lateral PNP device; introducing N conductivity type impurity into the substrate through at least the second region to thereby form an NPN emitter region; and providing electrical connections to the NPN emitter and base and to the PNP injector.

In other embodiments of the process of my invention, a static random access memory cell is fabricated in which the lateral NPN base width is substantially reduced. In still further embodiments, the buried collector is doubly doped.

DETAILED DESCRIPTION OF THE PREFERRED EMBODIMENT

Figure 1:
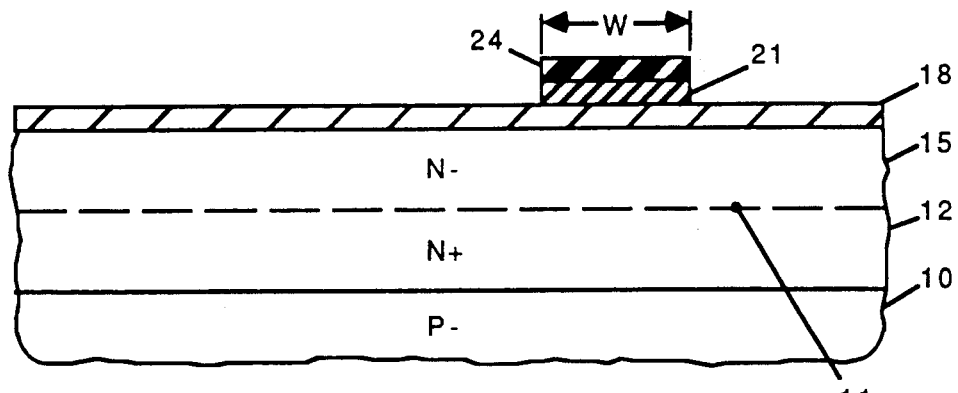
FIG. 1 is a cross-sectional view of a semiconductor structure illustrating formation of a first impurity mask.

FIG. 1 is a cross-sectional view of a semiconductor structure which may be fabricated using well known technology. For example, in a preferred embodiment the process begins with a silicon wafer 10 doped with P-type impurity to a resistivity on the order 10-20 ohm-centimeters. Then using well-known ion-implantation techniques, an N conductivity type impurity is implanted into the upper surface 11 of the wafer 10 to form a heavily doped N+ region 12 which will function as a buried collector for the vertical NPN device, as well as a base for the vertical PNP device, in other words, the parasitic vertical substrate PNP transistor. In the preferred embodiment, region 12 is doped with arsenic to a concentration of approximately $1-3 \times 10^{19}$ atoms per cubic centimeter at the epi-substrate interface before the epi deposition, and a junction depth of approximately 1-2 microns after the entire process is completed. This gives low enough sheet resistivity to minimize the lateral component of the collector resistance and to reduce the parasitic vertical PNP current gain to an acceptable level. Then, employing conventional semiconductor fabrication technology, an epitaxial layer 15 is formed across the upper surface of the structure. Layer 15 will be about 1-1.5 microns thick, and will have an impurity concentration of approximately $1-2 \times 10^{16}$ atoms per cubic centimeter of arsenic or phosphorus.

Next, and not shown in the figures, suitable isolation regions are formed to create islands of semiconductor material in which active devices will be formed. This is achieved, in the preferred embodiment, by forming regions of oxidized silicon which extend into the structure to the PN junction between regions 10 and 12. By forming these regions of silicon dioxide in an annular shape (as viewed from above), electrically isolated pockets of silicon are created. FIG. 1 is a cross-sectional view of one such pocket, but does not show the oxide isolation regions. Such epitaxial pockets of silicon may be fabricated using any well known oxide isolation process, for example, as described by Douglas Peltzer in U.S. Pat. No. 3,648,125 entitled "Method of Fabricating Integrated Circuits with Oxidized Isolation and the Resulting Structure." Of course, other isolation techniques such as guard rings may also be employed. As will become evident, the process of my invention does not require any particular isolation technology to be employed in place of any other.

At the completion of the isolation process, a layer of silicon dioxide 18 is formed on the upper surface of epitaxial layer 15 using a suitable thermal process. In the preferred embodiment silicon dioxide 18 is 1500-2500 Angstroms thick. The thickness of the silicon dioxide 18 is determined by various considerations. First, it should be at least five to ten times thicker than the screen oxide 30 to allow a self-aligned contact opening using a short etch (dip) in HF before metallization. It should be also thick enough to mask the arsenic implant for self-aligned p-n junction definitions. It should also be thin enough not to mask the boron implants which are used to define the P regions in the structure. In the process, the oxide thickness which is used is 1750 Angstroms.

Next, a layer of silicon nitride 21 is formed across the upper surface of silicon dioxide 18. The thickness of the silicon nitride will be determined by the energy used for a subsequent boron implant (or vice versa). As described below in conjunction with FIG. 3, the combined thicknesses of silicon dioxide 18 and silicon nitride 21 mask a boron implant. Thus, the combined thickness of the two layers must be such as to prevent boron from entering epitaxial layer 15. For example, if 100 keV implant energy is employed, a combined thickness of about 0.3 microns will suffice. Alternatively, if 200 keV is employed, then a combined thickness of 0.6 microns is required. After formation of silicon nitride layer 21, another layer of silicon dioxide 24 is deposited across the upper surface of nitride 21.

Using conventional techniques, silicon dioxide 24 is patterned into a desired region, such as the small region depicted in FIG. 1. Such conventional techniques typically will include formation of a layer of photoresist over silicon dioxide 24, exposure of the photoresist through a mask, and etching of layer 24 using a well known wet (chemical) or dry (plasma) process which attacks silicon dioxide 24 but not silicon nitride 21. As will be explained below, the width W of silicon dioxide 24 determines the width of the base of the lateral PNP device. Accordingly, in the preferred embodiment a width W on the order of 1.5-1.6 microns is employed. This width will make the lateral PNP base width substantially less than 1 micron.

After definition of silicon dioxide 24, the thereby-exposed regions of the layer of silicon nitride 21 are etched, this time employing a wet or dry process which attacks silicon nitride but not silicon dioxide. In the preferred embodiment, plasma etching is employed to carry out this process. At the completion of the etching of silicon nitride 21, the appearance of the structure is as depicted in FIG. 1.

Figure 2:
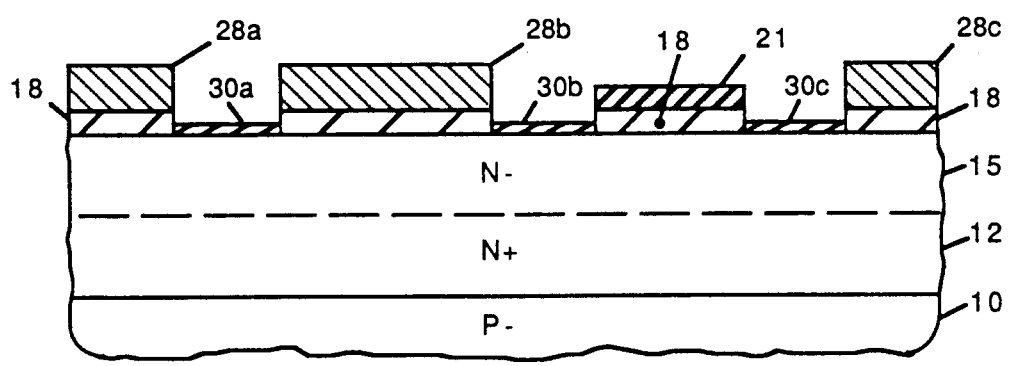
FIG. 2 is a subsequent cross-sectional view after removal of a first insulating layer from regions adjacent the impurity mask and partial reformation thereof.

FIG. 2 illustrates the next stages of the process of my invention. A layer of photoresist 28 is deposited across the upper surface of the structure and defined into regions 28a, 28b, and 28c. These photoresist regions serve to protect silicon dioxide 18 wherever electrical contacts to the substrate are not desired. Additionally, photoresist layer 28 will be removed from any region of the substrate where it is desired to implant P conductivity type impurity more deeply than in other regions.

After the photoresist 28 is defined into the desired pattern, again using well known photolithographic techniques, the exposed portions of silicon dioxide 18 between the regions of photoresist 28 are etched, again using any well known wet or dry process. In the preferred embodiment, plasma etching is employed for this process. During this etching, the silicon dioxide cap 24 on silicon nitride mask 21 also will be removed. The etching process may be achieved using either of two techniques. In the preferred embodiment, it is carried out for a period of time sufficient to completely remove silicon dioxide from the surface of the substrate 15 in the regions unprotected by photoresist 28. Then a new thinner layer of silicon dioxide 30 is formed in the openings. In the preferred embodiment silicon dioxide 30 is approximately 100-250 Angstroms thick and formed by heating the structure in an oxidizing ambient. This step is required to create a self-aligned metal contact, and to prevent out-gasing of the impurities from these contact windows. The oxide thickness is thin enough not to mask the impurities which will be introduced into silicon by implantation. The oxide 30 is also thick enough to prevent out-gasing of the impurities in the anneal cycle. These oxide properties also are known as "screen oxide" properties. Screen oxide 30 prevents the undesired effects of implantation directly into bare silicon. As a result, for 60KeV arsenic implants for the N regions below the contact openings, the oxide thickness should be less than 250 Angstroms.

In an alternative embodiment the etching of the layer 18 is performed for a shorter period of time to leave the relatively thinner regions of silicon dioxide in the regions unprotected by photoresist 28. At the completion of either process, the appearance of the structure is as depicted in FIG. 2.

Figure 3:
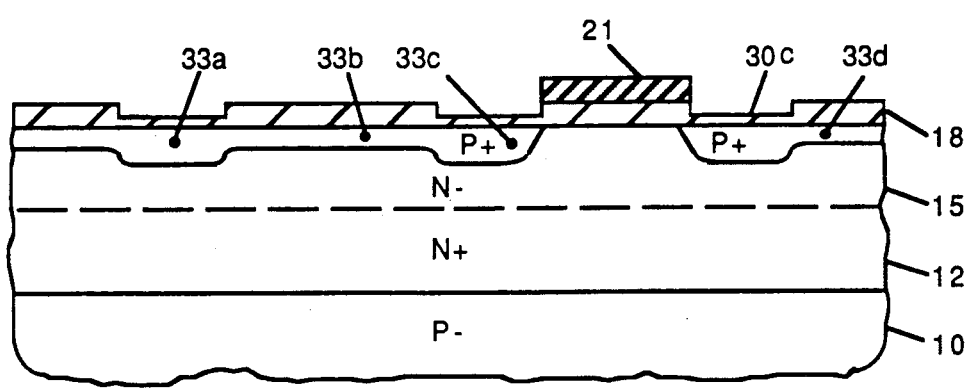
FIG. 3 is a subsequent cross-sectional view after introduction of P-type dopant for the NPN base and PNP injector.

The photoresist 28 then is removed from the structure and boron ions implanted, using well known ion-implantation techniques. The boron is implanted with sufficient energy to penetrate the differing thicknesses of silicon dioxide 18 and 30, but not with sufficient energy to penetrate the combined thickness of silicon dioxide 18 and silicon nitride 21. As mentioned above, the energy required will depend upon the thickness of the silicon dioxide and silicon nitride. In the preferred embodiment, I employ two boron implants with different doses and energies, to achieve lower vertical NPN Gummel numbers as well as maintain low extrinsic base and contact resistances. Dosage and energies used are $8 \times 10^{12}$ cm$^{-2}$, 120KeV and $1.45 \times 10^{-2}$, 50KeV for intrinsic and extrinsic base implants, respectively. As a result of this process, heavily doped P-type regions 33 are formed in epitaxial layer 15 adjacent its upper surface. Where the silicon dioxide 18 is thicker, the boron atoms do not penetrate as far into the epitaxial layer 15, and consequently shallower regions of boron impurity such as regions 33b and 33d are formed. Where the silicon dioxide is thinner than the original thickness, the boron will penetrate more deeply into the epitaxial layer and form regions such as 33a and 33c. The importance of these deeper regions is discussed below. After implanting the boron, the appearance of the structure is as depicted in FIG. 3.

Figure 4:
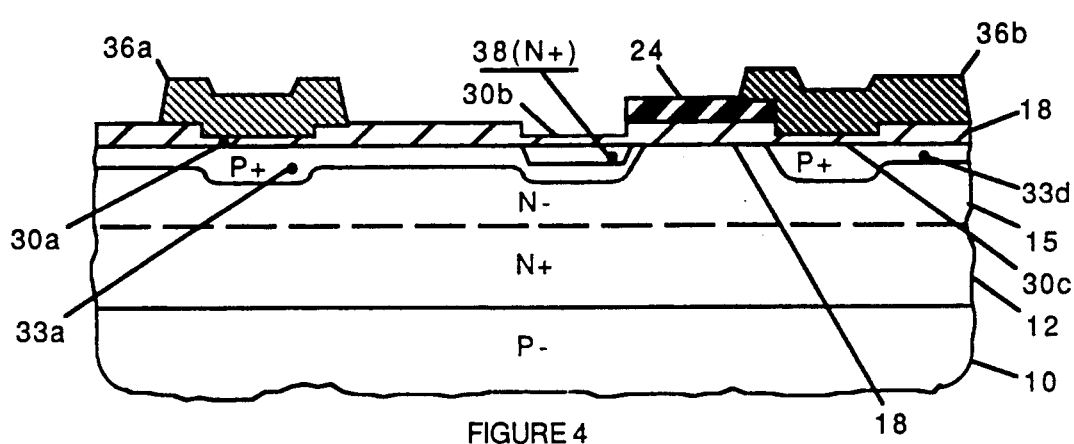
FIG. 4 is a subsequent cross-sectional view after introduction of N-type dopant for the NPN emitter.

An emitter mask 36 then is formed across the surface of the structure to protect the thinner regions of silicon dioxide 30a and 30c where emitters for the NPN devices are not desired. Once mask 36 is suitably patterned, again using well known photolithographic techniques, arsenic or other suitable N conductivity type impurity is implanted into the epitaxial layer 15 through the thin region of silicon dioxide 30b to form an emitter region 38. Region 38 is doped with arsenic to a concentration of $1-2 \times 10^{20}$ cm$^{-3}$ giving 0.2–0.25 microns of junction depth after the process is completed. To achieve this I use an arsenic implantation with a dose and energy of $10^{16}$ cm$^{-2}$ and 60KeV, respectively. The N$^+$regions formed as explained will give high emitter injection efficiency and low contact resistance. Emitter mask sections 36 are then removed by suitable methods, well known in the art. The appearance of the structure at this stage of the process is shown in FIG. 4.

Figure 5:
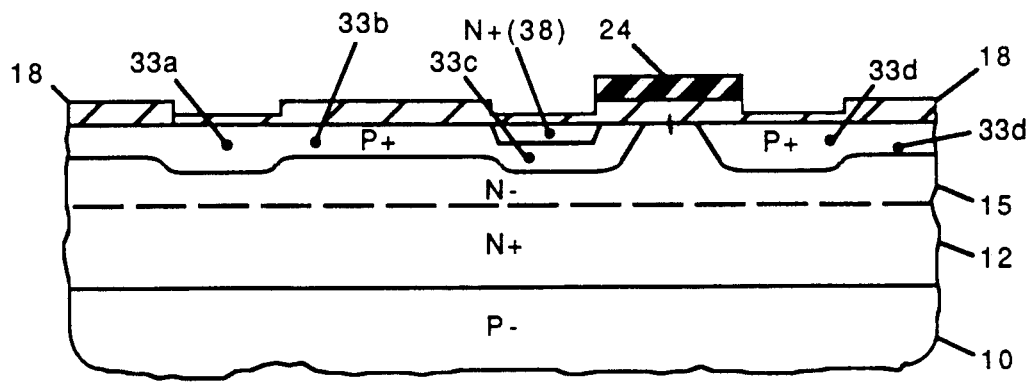
FIG. 5 is a subsequent cross-sectional view after annealing of the structure and diffusion of the impurities introduced.

The structure is then placed in a furnace and heated to 1000° C. for 40 minutes to anneal the damage caused by the implantation, and thereby reorder the monocrystalline silicon 15. As shown in FIG. 5, during this process the impurity implanted to form the P and N conductivity type regions 33 and 38 will diffuse further out into the epitaxial silicon 15. Importantly, because of the higher diffusivity of boron over arsenic, the P-type region 33c will diffuse further under the mask of silicon nitride 24, than will N-type region 38. At the same time the P-type impurity 33d will also diffuse beneath nitride 24, thereby narrowing the base width of the lateral PNP device to well less than 1 micron. The appearance of the structure following annealing is shown in FIG. 5.

Figure 6:
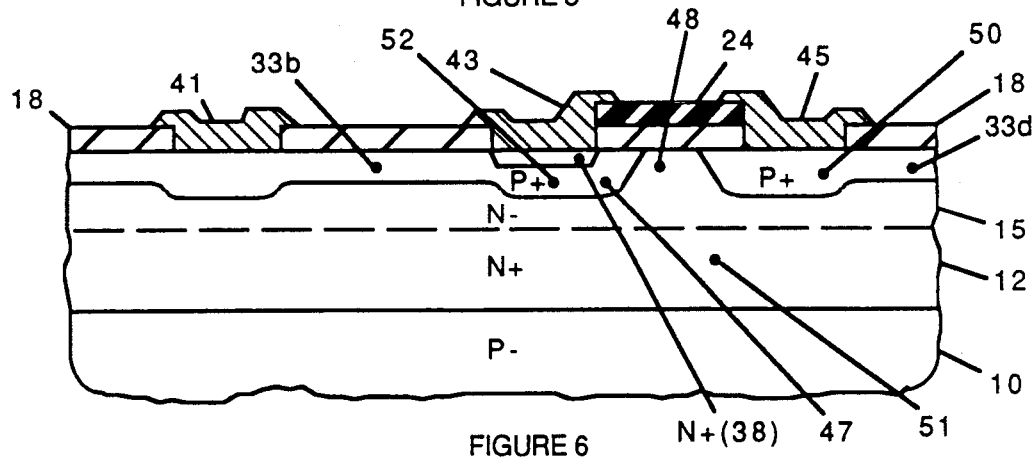
FIG. 6 is a subsequent cross-sectional view after formation of electrical contacts.

FIG. 6 is a cross section of the completed structure. Following the annealing, ohmic contacts may be fabricated on the surface of the desired regions using any well known technique. For example, silicon dioxide 18 may be masked and openings formed therein to expose the upper surface of the NPN base region 33b, the NPN emitter region 38, and the PNP injector region 33d.

Alternatively, and depending upon the relative thicknesses of the thinner and thicker portions of silicon dioxide 18, the structure may be dipped in an etching solution for a sufficiently short period of time to etch through the thin regions of layer 18, but not the thick ones. Then a layer of aluminum is deposited and defined into contacts 41, 43, and 45 to provide electrical connections to the desired regions. In another embodiment, electrically conductive material, such as a silicide compound, is deposited across the integrated circuit and defined into contacts as shown in FIG. 6.

In FIG. 6 additional reference numerals have been added to designate the various functional portions of the structure. For example, the lateral NPN base 47, the lateral PNP base 48, the vertical PNP base 51, and the vertical NPN base 52 are designated.

Figure 7:
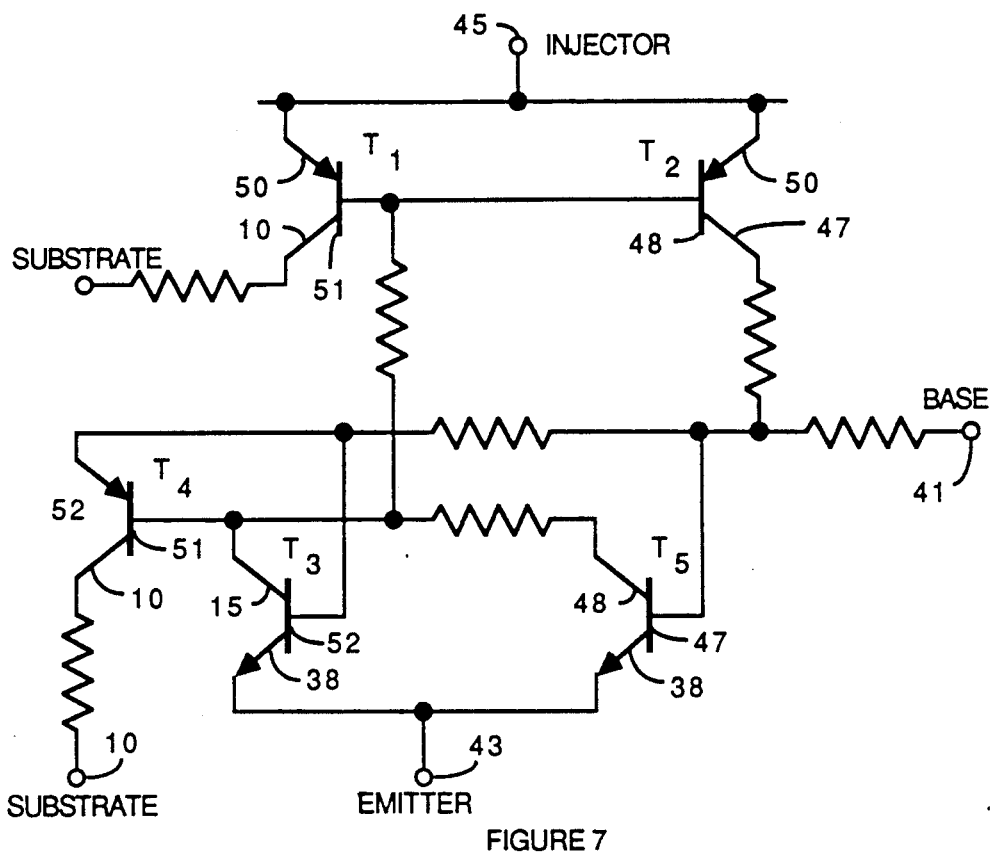
FIG. 7 is a circuit schematic illustrating the circuit formed by the structure of FIG. 6.

FIG. 7 is a simplified equivalent circuit of the silicon-controlled rectifier structure shown in FIG. 6 with corresponding regions of the structure and portions of the schematic being given the same reference numerals. Transistor $T_2$ is the lateral PNP device having injector 50, base 48, and collector 47. Transistor $T_5$ is the lateral NPN device having emitter 38, base 47, and collector 48. Transistor $T_3$ is the vertical NPN transistor formed by emitter 38, base 52, and collector 15, while transistors $T_1$ and $T_4$ are the parasitic substrate PNP transistors, with transistor $T_1$ having emitter 50, base 51, and collector 10, and transistor $T_4$ having emitter 52, base 51, and collector 10. FIG. 7 also shows the various parasitic resistances.

In FIG. 6 the lateral NPN base width 47 is substantially narrower than available with prior art techniques by virtue of the self-aligned nature of my process. In particular, while the starting base width is defined by a masking dimension, that is, width W in FIG. 1, the ultimate base width may be made substantially narrower than this masking tolerance, with the ultimate base width depending upon the amount of impurity used to form the P-type regions, and the parameters of the annealing process during which the diffusion occurs. The self-alignment of the right edge of the emitter and the base regions with the left edge of the injector in the manner depicted in the figures creates a compact structure and substantially reduces the NPN base width. Because the stored charge beneath the lateral NPN base determines the switching time, the width is made as narrow as possible. By fabricating it in the manner described above, the volume of stored charge may be reduced by a factor of ten or more when compared to the prior art. Because the lateral NPN base width and the Gummel number is on the same order as the vertical NPN device ($T_3$), the gain and the reverse saturation current density of transistors $T_5$ and $T_3$ will be approximately the same, resulting in active device operation of transistor $T_5$.

In another embodiment of my invention, polycrystalline silicon is used in place of silicon nitride. The use of polysilicon is advantageous because it is significantly easier to form a thick enough mask which replaces the nitride 21 if higher energy boron implants are to be used in the process. Moreover, using polysilicon as a mask will enable incorporating polysilicon emitter structures in the process without major modifications.

The structure which results from the process of my invention may be employed in many applications, for example, in PROMs where high performance SCRs are required to blow the fuses. The structure of my invention reduces the stored charge by as much as 50% and reduces the cell length, while also lowering substrate injection and standby current. As a result, the device provides increased speed, higher performance, and better packing densities than currently-available SCRs.

Figure 8:
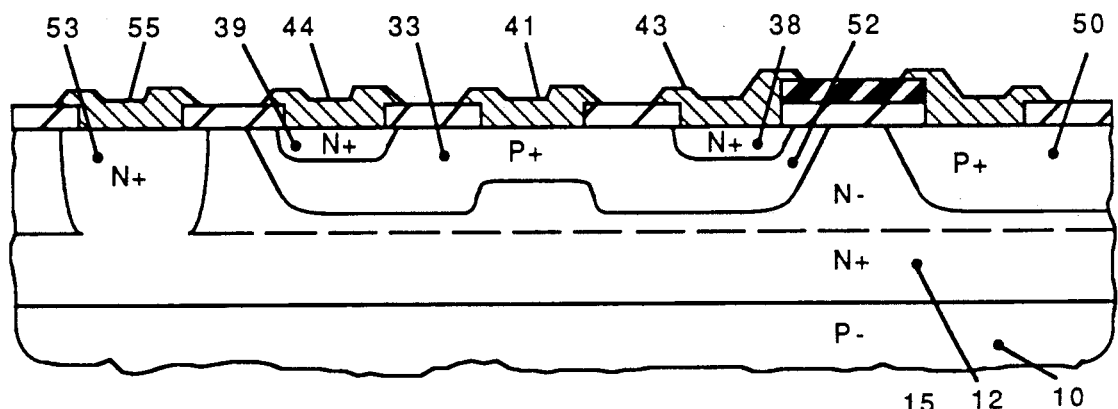
FIG. 8 illustrates a portion of a static random access memory cell fabricated using the process of FIGS. 1–6.

FIG. 8 is a cross-sectional view of another structure which may be fabricated using the process of my invention. FIG. 8 is one-half of a static random access memory cell. In practice a duplicate structure would be disposed nearby with commonly connected standby emitters 39 and injectors 50 and cross-coupled bases 33 and collectors 12. The structure of FIG. 8 is fabricated in the same manner as the structure of FIG. 6. The standby emitter 39 is introduced into P-type region 33 at the same time emitter 38 is formed. An electrical connection 44 is made to emitter 39 at the surface of the structure, while the NPN base contact 41 is disposed between the emitter contacts 43 and 44. FIG. 8 also illustrates a collector contact 53 extending from an ohmic contact 55 on the surface to the buried collector region 12. This contact is formed after the oxide isolation but prior to FIG. 1, in the manner described in the Peltzer patent.

Figure 9:
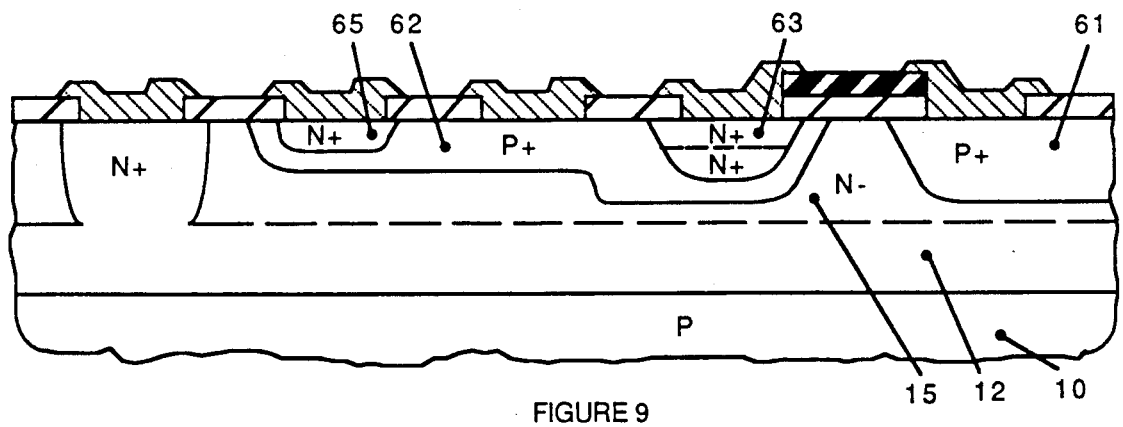
FIG. 9 illustrates an alternative embodiment of FIG. 8 in which the NPN base is deeply diffused.

FIG. 9 is a cross-sectional view of an alternative embodiment of a random access memory cell which may be fabricated using the technique described above in conjunction with FIGS. 1-6. The structure of FIG. 9 has been modified, however, in that more P-type dopant 60 and 61 has been introduced than in the previous process. The base 60 and injector region 61 are formed in the same manner as described in conjunction with FIGS. 1-6, but with implantation through larger openings. By extending the injector 61 even deeper in the manner depicted in FIG. 8, the lateral injection efficiency of the injector is increased. In this manner the peripheral-area-to-floor-area ratio of the injector is increased and the injection efficiency of the floor is reduced by an order of magnitude. Reducing the injection efficiency of the floor reduces the substrate injection and injected hole charge in the subcollector and to the substrate substantially. Additionally, the emitter 63 is given additional dopant, or is doped with phosphorus while the standby emitter 65 is doped with arsenic. Driving the base diffusions down, almost to the buried layer, provides higher current gain and larger current drive for the lateral PNP device.

Figure 10:
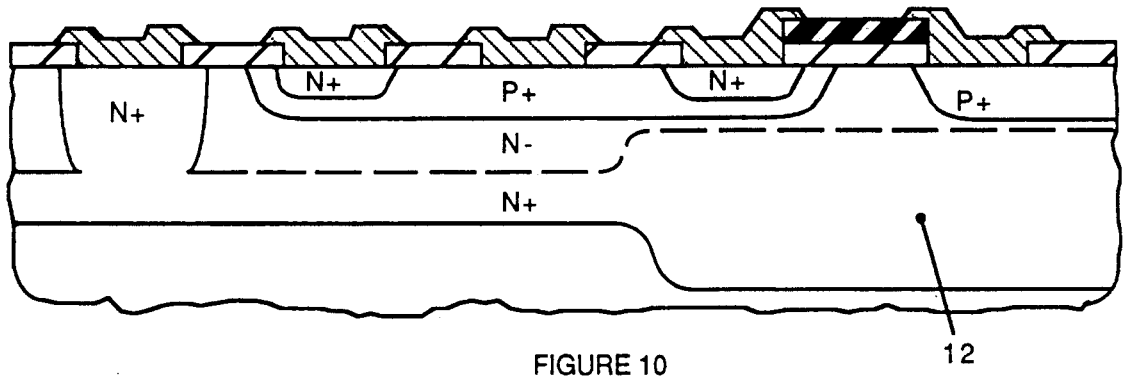
FIG. 10 illustrates another alternative embodiment in which portions of the buried layer are doubly implanted.

FIG. 10 is a cross-sectional view of another semiconductor structure which may be fabricated using the process of my invention. In FIG. 10, the lateral injection efficiency of the injector is increased by allowing a portion of the buried collector to up diffuse more than other portions. Because the floor injection efficiency is reduced by having larger donor concentration at the injector-buried layer junction, hole injection to the buried layer and to the substrate will be reduced. Additionally, the parasitic substrate PNP base Gummel number will be increased which will reduce substrate injection even more.

The structure shown in FIG. 10 may be fabricated by implanting the buried layer 12 with arsenic or antimony in the conventional manner, and then also implanting phosphorus into those portions of the substrate where the buried layer 12 is desired to up diffuse in the manner depicted. Because phosphorus diffuses faster in silicon than arsenic or antimony, it will reach the injector in the base region adjacent the injector allowing the desired structure to be achieved.

The foregoing has been a description of preferred embodiments of the process of my invention. Although numerous details have been provided regarding the operation and fabrication of the structures depicted, these details have been provided for the purpose of illustration. The scope of the invention may be ascertained from the appended claims.

I claim:

1. A method of fabricating a lateral silicon-controlled rectifier semiconductor structure comprising:
   forming a first insulating layer of first thickness on a semiconductor substrate, the substrate including an upper region of first conductivity type disposed on a lower region of opposite conductivity type;
   forming a first impurity mask on the first insulating layer over a first region of the substrate;
   removing at least part of the first insulating layer disposed over a second region of the substrate adjacent the first region;
   introducing opposite conductivity type impurity into the substrate except where overlaid by the first insulating layer to thereby form a spaced apart third and fourth regions;
   introducing first conductivity type impurity into the substrate into at least the second region; and
   providing electrical connections to the second region, the third region, and the fourth region.

2. A method as in claim 1 wherein the third region is disposed to surround the second region.

3. A method as in claim 2 wherein the step of removing further comprises removing at least part of the first thickness of the first insulating layer over a selected part of the third region, the selected part being a part of the third region where deeper penetration of the opposite conductivity type impurity is desired.

4. A method as in claim 2 wherein the substrate comprises silicon, the first insulating layer comprises silicon dioxide, and the first impurity mask comprises silicon nitride.

5. A method as in claim 4 wherein the first conductivity type is P.

6. A method as in claim 3 wherein the step of removing comprises:
   removing all of the first insulating layer over the second region and all of the first insulating layer over the selected part of the third region.

7. A method as in claim 6 wherein the step of removing at least part of the first thickness of the first insulating layer over a selected part of the third region comprises:
   removing all of the first insulating layer over the second region and all of the first insulating layer over the selected part of the third region.

8. A method as in claim 7 wherein the further insulating material is of second thickness less than the first thickness.

9. A method as in claim 2 wherein the step of removing further comprises removing at least part of the first thickness of the first insulating layer over a fifth region, the fifth region being spaced apart from the second region but also surrounded by the third region.

10. A method as in claim 9 wherein the step of introducing first conductivity type impurity into the substrate further comprises introducing first conductivity type impurity into the fifth region.

11. A method as in claim 2 wherein the upper region of the substrate comprises a lower portion more heavily doped than an upper portion.

12. A method as in claim 11 wherein the third and the fourth regions extend into the upper portion of the substrate and not into the lower portion.

13. A method as in claim 9 wherein prior to the step of forming a first impurity mask, first conductivity type impurity is introduced into a sixth region of the substrate separated from both the third and fourth regions to form a connection to the lower portion of the substrate.

14. A method as in claim 1 further comprising prior to the step of forming a first insulating layer the steps of:
  introducing a selected first conductivity type impurity into an opposite conductivity type silicon wafer to form a buried layer; and
  depositing a silicon layer of first conductivity type on the silicon wafer to thereby form the substrate.

15. A method as in claim 14 wherein the silicon layer is doped with a lesser quantity of first conductivity type than the buried layer.

16. A method as in claim 14 wherein the step of introducing a selected first conductivity type impurity further comprises introducing the selected impurity into all of the silicon wafer beneath the first, third and fourth regions.

17. A method of fabricating a self-aligned lateral silicon-controlled rectifier circuit comprising:
  forming a first layer on a semiconductor substrate which includes an underlying P conductivity type region and an overlying N conductivity type region;
  forming a masking layer on the first layer over a first region of the substrate;
  removing at least part of the masking layer from over a second region and a third region of the substrate, the second and third regions being separated by the first region;
  introducing P conductivity type impurity into the substrate into the third region and a fourth region surrounding the second region;
  introducing N conductivity type impurity into the substrate into at least the second region; and
  forming electrical connections to the second region, the third region, and the fourth region.

* * * * *